(12) United States Patent
Yang et al.

(10) Patent No.: US 9,086,861 B2
(45) Date of Patent: Jul. 21, 2015

(54) HEAT DISSIPATION SYSTEM WITH AIR DUCT

(71) Applicant: Zhongshan Innocloud Intellectual Property Services Co., Ltd., Zhongshan (CN)

(72) Inventors: Cheng-Hsiu Yang, New Taipei (TW); Chih-Ta Huang, New Taipei (TW)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 234 days.

(21) Appl. No.: 13/779,746

(22) Filed: Feb. 28, 2013

(65) Prior Publication Data

US 2014/0204523 A1 Jul. 24, 2014

(30) Foreign Application Priority Data

Jan. 22, 2013 (TW) .................................. 102102314

(51) Int. Cl.
*H05K 7/20* (2006.01)
*G06F 1/20* (2006.01)

(52) U.S. Cl.
CPC .............. *G06F 1/20* (2013.01); *H05K 7/20136* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,573,712 | B2 * | 8/2009 | Wu et al. ........................ | 361/695 |
| 7,643,292 | B1 * | 1/2010 | Chen .............................. | 361/695 |
| 8,081,444 | B2 * | 12/2011 | Xiao et al. ............... | 361/679.49 |
| 2005/0219813 | A1 * | 10/2005 | Cravens et al. ............... | 361/690 |
| 2007/0236882 | A1 * | 10/2007 | Chen .............................. | 361/695 |
| 2008/0101011 | A1 * | 5/2008 | Carr et al. ..................... | 361/686 |

\* cited by examiner

*Primary Examiner* — Gregory Thompson
(74) *Attorney, Agent, or Firm* — Novak Druce Connolly Bove + Quigg LLP

(57) ABSTRACT

An air duct includes a hollow main body defining a through slot, an inlet member and an outlet member connected to opposite ends of the main body. The inlet member includes a top wall, a bottom wall, a first sidewall, and a second sidewall. The second sidewall slantingly extends forward and away from the first sidewall. A space communicating with the through slot is bounded by the top wall, the bottom wall, and the first and second sidewalls. The space has an inlet wider than the through slot. The outlet member is perpendicularly connected to the main body and defines an outlet communicating with the through slot.

7 Claims, 2 Drawing Sheets

HEAT DISSIPATION SYSTEM WITH AIR DUCT

BACKGROUND

1. Technical Field

The present disclosure relates to a heat dissipation system including an air duct.

2. Description of Related Art

Portions of airflow meant for central processing units (CPUs) often flow to lower portions of memory slots positioned adjacent to the CPUs, which lowers the heat dissipation efficiency for the CPUs.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
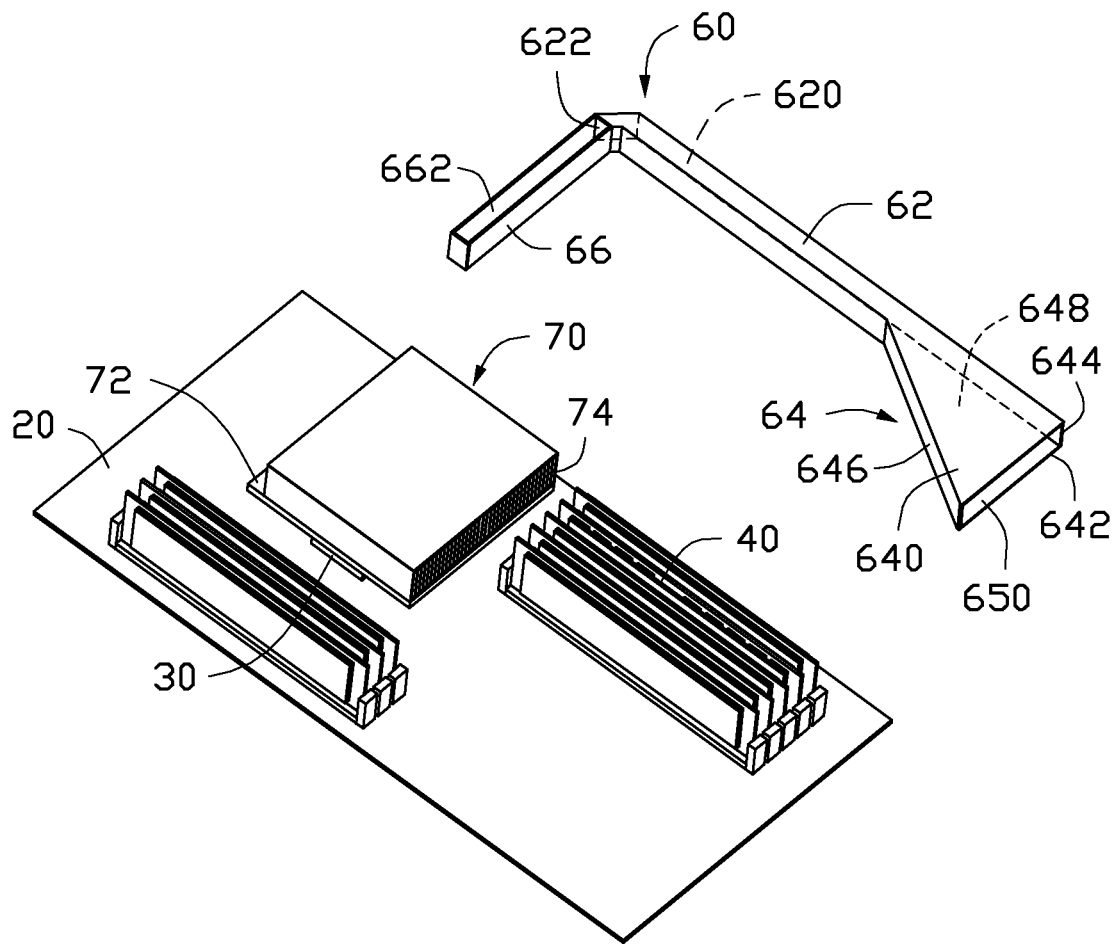
FIG. 1 is an exploded, isometric view of an exemplary embodiment of a heat dissipation system.

Referring to FIG. 1, an exemplary embodiment of a heat dissipation system includes a motherboard 20, a central processing unit (CPU) 30 mounted on the motherboard 20, a memory slot group 40 mounted on the motherboard 20, and in front of the CPU 30, a heat sink 70 mounted on the CPU 30, and an air duct 60.

The heat sink 70 includes a board 72 contacting a top of the CPU 30, and a plurality of fins 74 extending up from the board 72 in a substantially perpendicular manner.

The air duct 60 includes a hollow main body 62, an inlet member 64 connected to a front end of the main body 62, and an outlet member 66 perpendicularly connected to a rear end of the main body 62.

The main body 62 defines a through slot 620 extending through the front end and the rear end of the main body 62. The through slot 620 having an opening 622 at the rear end of the main body 62.

The inlet member 64 includes a right-triangular top wall 640, a right-triangular bottom wall 642, a first sidewall 644 connected between corresponding sides of the top wall 640 and the bottom wall 642 and coplanar with a first side of the main body 62, and a second sidewall 646 connected between opposite sides of the top and bottom walls 640 and 642. The second sidewall 646 is slantingly connected to a second side of the main body 62 opposite to the first side and slantingly extends away from the first sidewall 644. Therefore, a space 648 communicating with the through slot 620 is bounded by the top wall 640, the bottom wall 642, the first sidewall 644, and the second sidewall 646. The space 648 has an inlet 650 away from the through slot 620, and the inlet 650 is wider than the through slot 620. An area of the inlet 650 is greater than an area of the opening 622 of the through slot 620.

The outlet member 66 defines an outlet 660 communicating with the opening 622 in a top surface.

Figure 2:
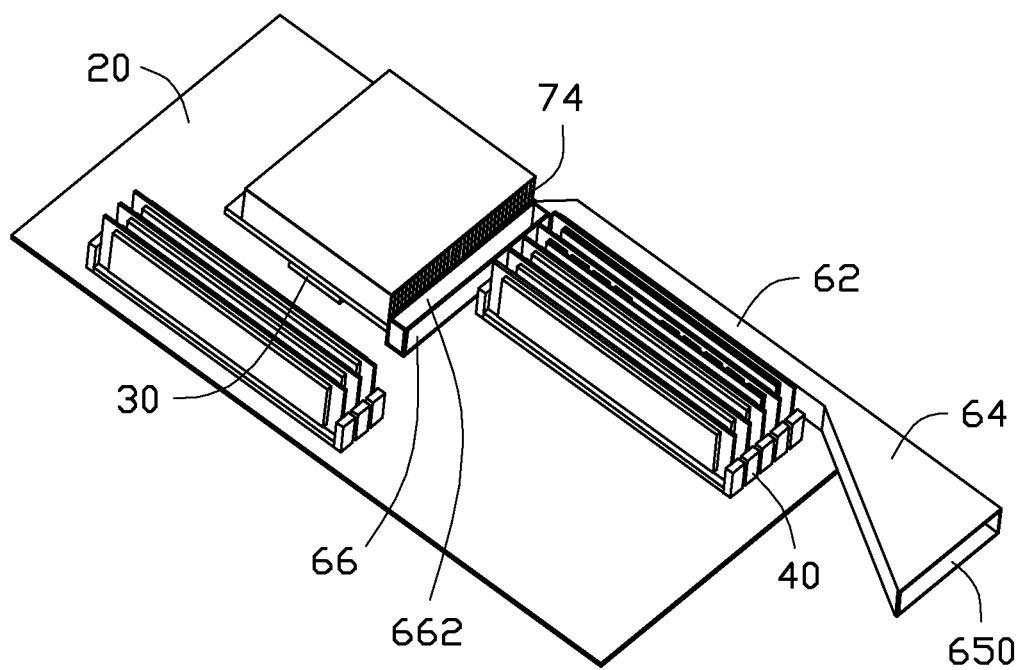
FIG. 2 is an assembled, isometric view of FIG. 1.

Referring to FIG. 2, in assembly, the air duct 60 is mounted on the motherboard 20, with the main body 62 positioned at a side of the memory slot group 40, the inlet member 64 positioned in front of a lower portion of the memory slot group 40, and the outlet member 66 positioned between the CPU 30 and the memory slot group 40 and covering a space between the board 72 and the motherboard 20.

In use, air flowing towards the lower portion of the memory group 40 is captured by the inlet 650 and directed to flow through the space 648, the through slot 620, and then out through the outlet 662 toward the fins 74.

Because of the air duct 60, the airflow that might otherwise flow to the lower portion of the memory group 40 is guided instead to the fins 74 to cool the CPU 30. Because the inlet 650 is wider than the through slot 620, or the area of the inlet 650 is greater than the area of the opening 622 of the through slot 620, the airflow will more rapidly flow out through the opening 622, which aids in heat dissipation. Moreover, the outlet member 66 covers the space between the board 72 and the motherboard 20, to prevent the airflow from flowing through the space between the board 72 and the motherboard 20.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. An air duct, comprising:
   a hollow main body defining a through slot extending through front end and rear end of the main body, the through slot having comprising an opening at the rear end of the main body;
   an inlet member connected to the front end of the main body; the inlet member defining a space communicating with the through slot, and an inlet communicating with the space and opposite to the through slot, the inlet member comprising a first sidewall and an opposite second sidewall bounding the space, the second sidewall slantingly extending forward and away from the first sidewall, wherein the inlet is wider than the through slot, an area of the inlet is greater than an area of the opening of the through slot; and
   an outlet member connected to a rear end of the main body in an angled manner; the outlet member defining an outlet communicating with the opening of the through slot.

2. The air duct of claim 1, wherein the outlet of the outlet member faces upward.

3. A heat dissipation system, comprising:
   a motherboard;
   a central processing unit (CPU) mounted on the motherboard;
   a memory slot group mounted on the motherboard and in front of the CPU; and
   an air duct mounted on the motherboard, the air duct comprising a hollow main body, and a hollow inlet member and a hollow outlet member connected to front and rear ends of the main body, wherein the main body is positioned at a side of the memory slot group, the inlet member is positioned at a front side of a lower portion of the memory slot group.

4. The heat dissipation system of claim 3, further comprising a heat sink mounted on the CPU, wherein the heat sink comprises a board contacting a top of the CPU, and a plurality of fins extending up from the board.

5. The heat dissipation system of claim 4, wherein the main body defines a through slot extending through the front and rear ends of the main body and having an opening at the rear end of the main body; the inlet member comprises a top wall, a bottom wall, a first sidewall, and a second sidewall all bounding a space communicating with the through slot, the first sidewall is opposite to the memory slot group, the second sidewall slantingly extends forward and away from the first sidewall, the space has an inlet opposite to the through slot and wider than the through slot; an area of the inlet is greater than an area of the opening of the through slot, the outlet member defines an outlet communicating with the through slot.

6. The heat dissipation system of claim 5, wherein the outlet of the outlet member faces upward.

7. The heat dissipation system of claim 5, wherein the outlet member is positioned between the memory slot group and the CPU, and covers a space between the motherboard and the board of the heat sink.

* * * * *